(12) United States Patent
Dehlinger et al.

(10) Patent No.: US 7,515,793 B2
(45) Date of Patent: Apr. 7, 2009

(54) WAVEGUIDE PHOTODETECTOR

(75) Inventors: Gabriel Dehlinger, Annenheim-Sattendorf (AT); Sharee J. McNab, Huntsbury (NZ); Yurii A. Vlasov, Katonah, NY (US); Fengnian Xia, Plainsboro, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/354,715

(22) Filed: Feb. 15, 2006

(65) Prior Publication Data
US 2007/0189688 A1 Aug. 16, 2007

(51) Int. Cl.
G02B 6/42 (2006.01)
G02B 6/12 (2006.01)

(52) U.S. Cl. .............. 385/40; 385/14; 385/50; 385/129; 385/131

(58) Field of Classification Search .......... None
See application file for complete search history.

(56) References Cited

U.S. PATENT DOCUMENTS

| | | | | |
|---|---|---|---|---|
| 3,898,605 | A * | 8/1975 | Burns ................... | 338/18 |
| 5,391,869 | A * | 2/1995 | Ade et al. .............. | 250/227.24 |
| 5,525,828 | A | 6/1996 | Bassous et al. | |
| 5,910,012 | A | 6/1999 | Takeuchi | |
| 6,310,995 | B1 | 10/2001 | Saini et al. | |
| 6,403,975 | B1 * | 6/2002 | Brunner et al. .......... | 257/15 |
| 6,594,409 | B2 * | 7/2003 | Dutt et al. ............... | 385/14 |
| 6,795,622 | B2 | 9/2004 | Forrest et al. | |
| 6,819,839 | B2 | 11/2004 | Zheng et al. | |
| 6,897,498 | B2 * | 5/2005 | Gothoskar et al. ........ | 257/226 |
| 7,095,938 | B2 * | 8/2006 | Tolstikhin .............. | 385/131 |
| 2007/0104411 | A1 * | 5/2007 | Ahn et al. .............. | 385/14 |

OTHER PUBLICATIONS

Yaocheng, Liu, et al., *High-quality single-crystal Ge on insulator by liquid-phase epitaxy on Si substrates*, 84 Applied Physics Letter 14, 2563-2565 (Apr. 5, 2004).
Yaocheng, Liu, et al. *Rapid Melt Growth of Germanium Crystals with Self-Aligned Microcrucibles on Si Substrates*, Journal of the Electrochemical Society 152, G688-G693 (Jul. 14, 2005).

* cited by examiner

Primary Examiner—Omar Rojas

(57) ABSTRACT

The present invention is a waveguide photodetector. In one embodiment, the waveguide photodetector includes a waveguide layer where light is guided or is confined and a detection layer formed on the waveguide layer where guided light is detected. Each of the waveguide layer and the detection layer allows for the guiding of no more than a single mode of light for a given polarization. In another embodiment, the waveguide photodetector includes a waveguide layer where light is guided or is confined, a detection layer formed on the waveguide layer where guided light is detected, a first electrical contact coupled to the detection layer, and a second electrical contact coupled to the detection layer. The first electrical contact and the second electrical contact are disposed in a spaced-apart, substantially parallel manner relative to each other.

15 Claims, 5 Drawing Sheets

WAVEGUIDE PHOTODETECTOR

BACKGROUND

The invention relates generally to optical waveguides, and relates more particularly to waveguide photodetectors for converting optical signals into electrical signals.

Optical interconnects can offer significant advantages over electrical circuitry in the field of advanced microelectronics. One possible implementation of a deeply-scaled optical interconnect system is based on silicon-on-insulator (SOI) technology, in which optical waveguides are formed (e.g., in accordance with CMOS technology) on a thin silicon device layer. Such a system requires four major components: a light source, an optical modulator for encoding data into light pulses, a waveguide for efficiently transporting light across the chip and a photodetector for converting optical signals into electrical signals. The lack of an effective photodetector for such applications has, however, impeded the development of highly scalable SOI interconnects to date.

In particular, the photodetector must be made from silicon (Si) or germanium (Ge) in order to be compatible with CMOS processing. However, if the waveguides of the interconnect system are made of Si, the operational wavelength range for light propagation is restricted to approximately 1.1 to 1.8 microns, where Si is transparent. Thus, a Ge photodetector would seem preferable. Typical Ge detectors, however, are vertically incident and thus are not compatible with monolithically integrated photonics on a SOI substrate. Horizontal in-plane implementation is also made difficult due to the large differences in relative refractive index between Si (approximately 3.5) and Ge (approximately 4.2), which complicates efficient coupling of light from the waveguide to the photodetector. Typical Ge detectors are also multimoded, which prevents efficient coupling between the waveguide and the photodetector. Moreover, typical Ge detectors in general suffer from large dark current and impaired bandwidth.

Thus, there is a need for a scalable waveguide photodetector that efficiently couples light from a waveguiding region to a detection region.

SUMMARY OF THE INVENTION

The present invention is a waveguide photodetector. In one embodiment, the waveguide photodetector includes a waveguide layer where light is guided or is confined and a detection layer formed on the waveguide layer where guided light is detected. Each of the waveguide layer and the detection layer allows for the guiding of no more than a single mode of light for a given polarization. In another embodiment, the waveguide photodetector includes a waveguide layer where light is guided or is confined, a detection layer formed on the waveguide layer where guided light is detected, a first electrical contact coupled to the detection layer, and a second electrical contact coupled to the detection layer. The first electrical contact and the second electrical contact are disposed in a spaced-apart, substantially parallel manner relative to each other.

BRIEF DESCRIPTION OF THE DRAWINGS

So that the manner in which the above recited embodiments of the invention are attained and can be understood in detail, a more particular description of the invention, briefly summarized above, may be obtained by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

In one embodiment, the present invention is a scalable waveguide photodetector. Embodiments of the present invention provide a horizontal in-plane waveguide photodetector that allows efficient coupling of light from a waveguiding region to a detection region, while also minimizing dark current. Moreover, when implemented in conjunction with improved electrical contact configurations, parasitic losses can be reduced and collection efficiency of photogenerated carriers can be increased.

Figure 1:
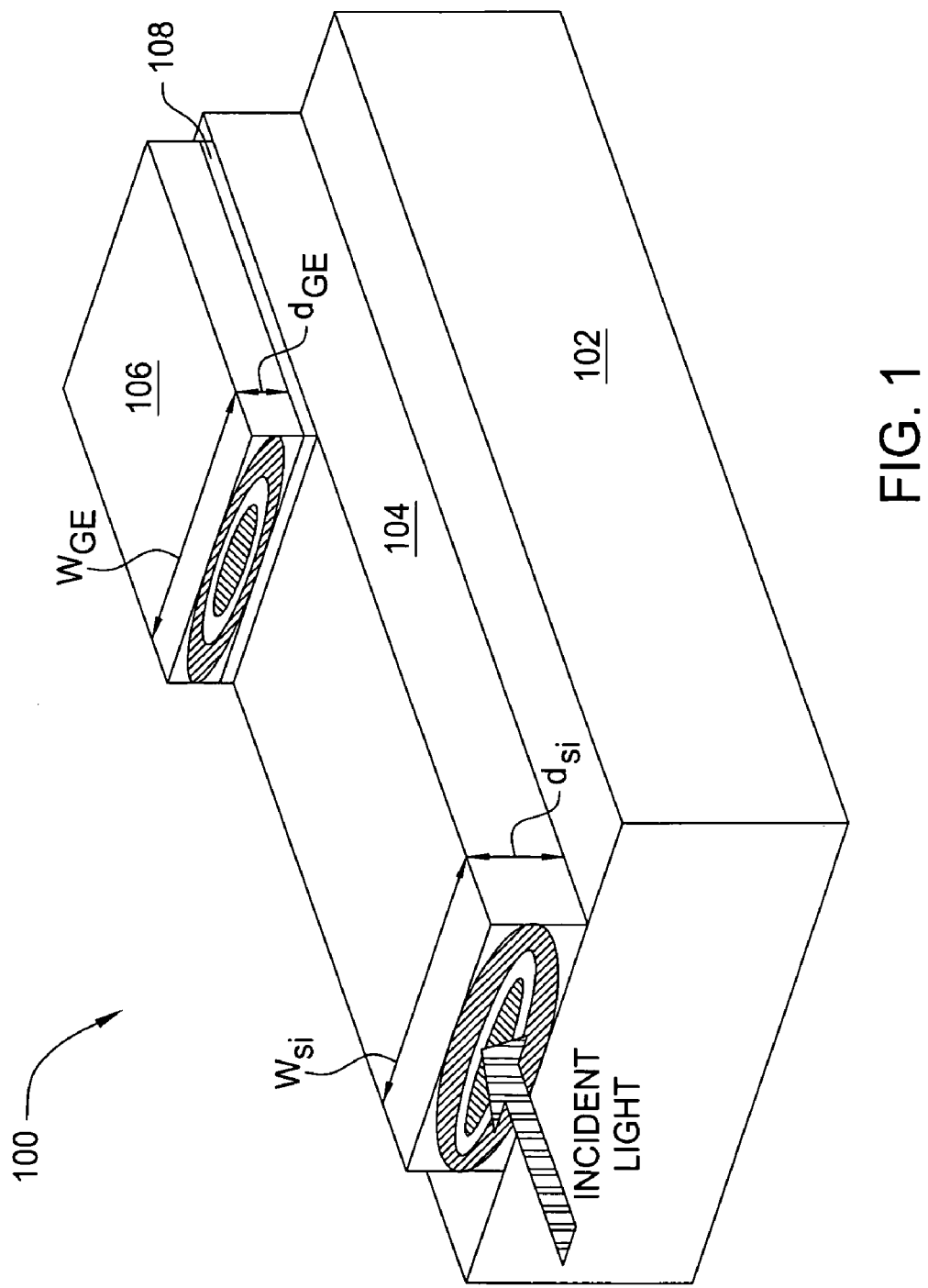
FIG. 1 is a perspective view of one embodiment of a waveguide photodetector, according to the present invention.

FIG. 1 is a perspective view of one embodiment of a waveguide photodetector 100, according to the present invention. Specifically, the photodetector 100 is a resonant coupling enhanced waveguide photodetector. Waveguide photodetectors accomplish two main optical functions: waveguiding and detection. That is, light first must be guided into the detection region, and then detected (absorbed). With this in mind, the photodetector 100 comprises a substrate 102, a waveguide layer 104 formed on the substrate 102 and a detection layer 106 formed on the waveguide layer 104. Thus, in this embodiment, the waveguide layer 104 is effectively "sandwiched" between the substrate 102 and the detection layer 106. In alternative embodiments, however, the entire photodetector structure may be buried under a thick oxide layer, in which case there is no "sandwiching" of the waveguide layer 104.

The substrate 102 is an insulator. In one embodiment, the substrate 102 is a buried oxide substrate (e.g., silicon oxide). The waveguide layer 104 is a single-mode strip waveguide in a wavelength of interest along its entire length and functions as a waveguiding region. By single-mode, it is meant that only one fundamental zeroeth order guiding mode exists in the waveguide layer 104 for a given polarization and wavelength, while the effective refractive index for a first-order mode of the same polarization is approximately equal to the refractive index of the substrate 102. That is, the waveguide layer 104 provides, along its length, for the waveguiding of only a single mode of incident light. In one embodiment, the waveguide layer 104 is formed of silicon. In one embodiment, the waveguide layer 104 has a width, $w_{Si}$, in the range of approximately 200 nanometers to approximately 600 nanometers and a thickness, $d_{Si}$, in the range of approximately 150 nanometers to approximately 350 nanometers. The relatively small dimensions of the waveguide layer 104 substantially ensure single-mode operation of the waveguide layer 104 for wavelengths in the range of approximately 1.3 µm to approximately 1.55 µm. Moreover, light can be effectively confined in the waveguide layer 104 due to the relatively large contrast in refractive index between silicon and an oxide or air.

The detection layer 106 is, like the waveguide layer 104, a single-mode strip waveguide and functions as a detection or absorption region. In one embodiment, the detection layer 106 is formed of single-crystal germanium. In another embodiment, the detection layer 106 is formed of other germanium-containing materials (e.g., poly-germanium, a silicon/germanium composite (e.g., $Si_xGe_{1-x}$) or a silicon/germanium/carbon composite (e.g., $Si_xGe_yC_{1-x-y}$)). In one embodiment, the width, $w_{Ge}$, of the detection layer 106 is in the range of approximately 50 nanometers to approximately 100 nanometers smaller than the width, $w_{Si}$, of the waveguide layer 104, while the thickness, $d_{Ge}$, of the detection layer 106 is less than or equal to approximately 250 nanometers.

In an optional embodiment of the present invention, the photodetector 100 further comprises an insulation layer 108 disposed between the waveguide layer 104 and the detection layer 106. The insulation layer 108 comprises a thin layer of dielectric material. The insulation layer 108 provides efficient electrical isolation of the detection layer 106 from the waveguide layer 104, thereby substantially reducing the collection of photocarriers generated in the waveguide layer 104 and increasing the operational bandwidth of the photodetector 100. At the same time, it is important to avoid excessive optical isolation of the detection layer 106 due to the excess thickness of the insulation layer 108 (i.e., the thickness of the insulation layer 108 may reduce the efficiency of the coupling of light from the waveguide layer 104 to the detection layer 106). In one embodiment, the insulation layer 108 has a thickness of less than approximately 30 nanometers to provide electrical insulation and to substantially avoid excessive optical isolation of the detection layer 106. In one embodiment, the insulation layer 108 is made of silicon dioxide. In another embodiment, the insulation layer 108 is made of silicon oxynitride ($SiO_xN_{1-x}$) or materials with high dielectric constants (i.e., high-k dielectrics) like hafnium oxide (HfO), among others.

In operation, a single mode of incident light enters and propagates through the waveguide layer 104. As the light propagates through the waveguide layer 104, it is resonantly coupled or guided to the detection layer 106 for detection (absorption). Thus, the optical waveguiding function is realized by both the waveguide layer 104 and the detection layer 106 (i.e., the light is guided by two super modes), while the detection function is realized by the detection layer 106 alone. The resonant coupling condition (i.e., the mode effective index of the waveguide layer 104 is approximately equal to that of the mode effective index of the detection layer 106) is achieved at least in part due to the adjusted relative thicknesses ($d_{Si}$ and $d_{Ge}$, respectively) of the waveguide layer 104 and the detection layer 106. Resonant coupling of the light allows for a reduction in both the length and the thickness of the detection layer 106 that are necessary for efficient absorption of most of the light (e.g., approximately ninety percent) in the waveguide layer 104. In turn, the reduced dimensions of the detection layer 106 allow for larger modulation bandwidth since carriers are now collected from a smaller volume and the photodetector 100 has a reduced capacitance. For example, the internal quantum efficiency can approach approximately one hundred percent using a germanium waveguide for the detection layer 106 with a length of less than or equal to approximately 20 μm at an incident light wavelength of 1.3 μm. Moreover, if the total volume of the detection layer 106 is less than approximately 1 μm³, relatively low dark current can be achieved.

In addition, the single-mode condition enforced in both the waveguide layer 104 and the detection layer 106 helps to reduce uncertainty in the optical field profile that is incident at the interface of the waveguide layer 104 and the detection layer 106. That is, in the absence of the single-mode condition, the optical field distribution in the waveguide layer 104 would be distributed between fundamental and different high-order optical modes and would vary as the light propagated through the waveguide layer 104, which would result in reduced light detection (absorption) efficiency in the detection layer 106. The detection efficiency of the photodetector is thus improved by enforcing the single-mode condition in both the waveguide layer 104 and the detection layer 106.

Figure 2:
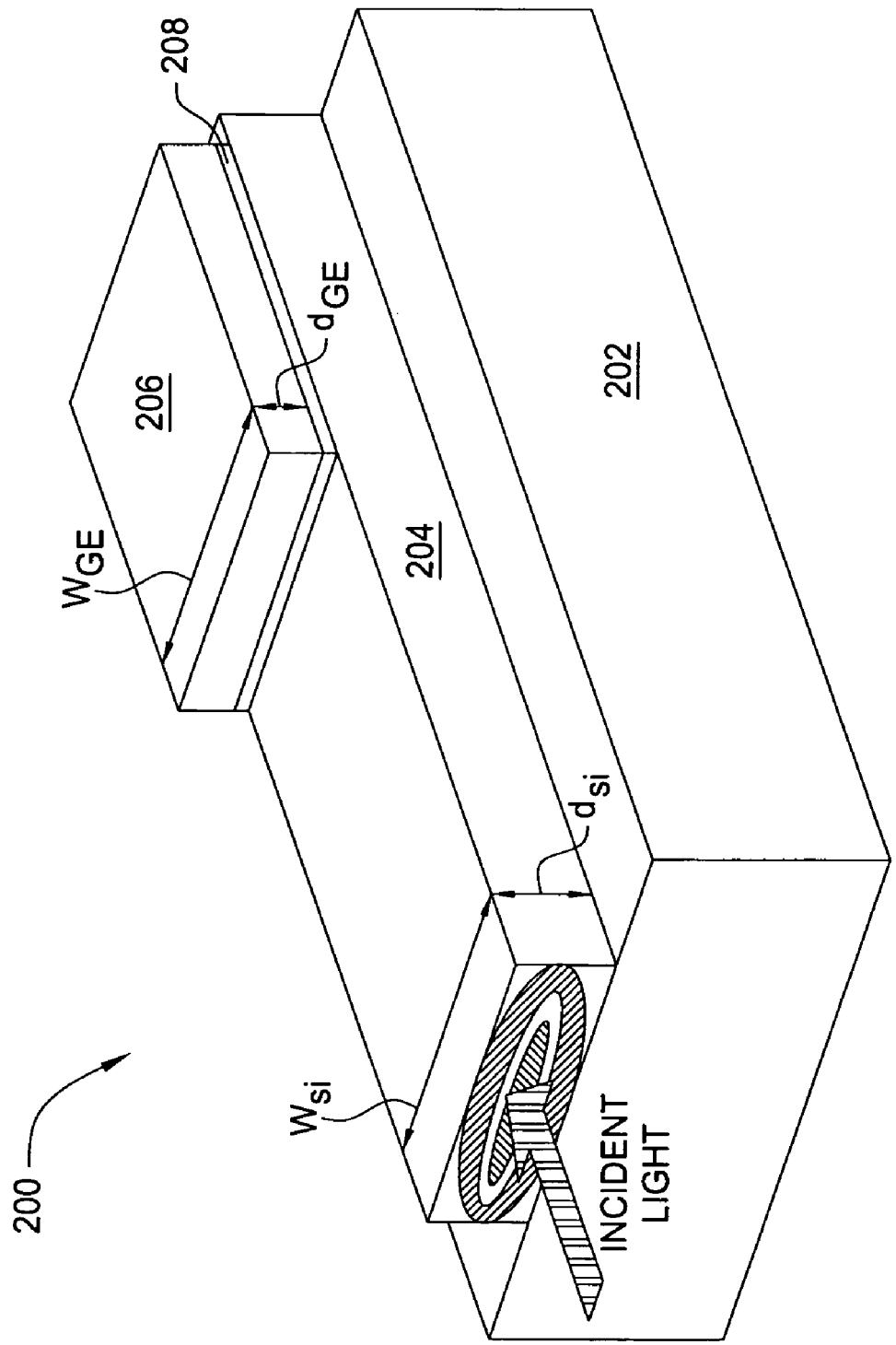
FIG. 2 is a perspective view of a second embodiment of a waveguide photodetector, according to the present invention.

FIG. 2 is a perspective view of a second embodiment of a waveguide photodetector 200, according to the present invention. Specifically, the photodetector 200 is an evanescently coupled waveguide photodetector. By "evanescently coupled", it is meant that light is transmitted from the waveguide layer to the detection layer by means of the evanescent (or decaying) waves. This is typically accomplished by placing two or more waveguides close together so that the evanescent field does not decay much in the vicinity of the other waveguide. Assuming the receiving waveguide can support mode(s) of the appropriate frequency, the evanescent field gives rise to propagating wave mode(s), thereby connecting (or coupling) the wave from one waveguide to the next. As explained in greater detail below, the photodetector 200 exploits this concept of evanescent coupling in order to couple propagating light from a waveguide layer to a detection layer.

To this end, the photodetector 200 comprises a substrate 202, a waveguide layer 204 formed on the substrate 202 and a detection layer 206 formed on the waveguide layer 204. Thus, in this embodiment, the waveguide layer 204 is effectively "sandwiched" between the substrate 202 and the detection layer 206. In alternative embodiments, however, the entire photodetector structure may be buried under a thick oxide layer, in which case there is no "sandwiching" of the waveguide layer 204.

The substrate 202 is an insulator. In one embodiment, the substrate 202 is a buried oxide substrate. The waveguide layer 204 is a single-mode strip waveguide in a wavelength of interest along its entire length and functions as a waveguiding region. That is, the waveguide layer 204 provides, along its length, for the waveguiding of only a single mode of incident light. In one embodiment, the waveguide layer 204 is formed of silicon. In one embodiment, the waveguide layer 204 has a width, $w_{Si}$, in the range of approximately 200 nanometers to approximately 600 nanometers and a thickness, $d_{Si}$, of less than or equal to approximately 350 nanometers. The relatively small dimensions of the waveguide layer 204 substantially ensure single-mode operation of the waveguide layer 204 for wavelengths in the range of approximately 1.3 μm to approximately 1.55 μm. Moreover, light can be effectively confined in the waveguide layer 204 due to the relatively large contrast in refractive index between silicon and an oxide or air.

The detection layer 206 functions as a detection or absorption region and operates at a cutoff condition (i.e., is thin enough to substantially ensure that no guiding mode exists in the detection layer 206 alone). As will be described in greater detail below, the absence of a guiding mode in the detection layer 206 substantially ensures that the detection layer 206 functions solely as a detection mechanism (and does not, for example, perform some of the waveguiding functions, as does the detection layer 106 of the photodetector 100, described above). In one embodiment, the detection layer 206 is formed of single-crystal germanium. In another embodiment, the detection layer 206 is formed of other germanium-containing materials (e.g., poly-germanium, a silicon/germanium composite (e.g., $Si_xGe_{1-x}$) or a silicon/germanium/carbon composite (e.g., $Si_xGe_yC_{1-x-y}$)). In one embodiment, the width, $w_{Ge}$, of the detection layer 206 is in the range of approximately 50 nanometers to approximately 100 nanometers smaller than the width, $w_{Si}$, of the waveguide layer 204, while the thickness, $d_{Ge}$, of the detection layer 206 is less than or equal to approximately 100 nanometers (i.e., thin enough to substantially ensure that no guiding mode exists).

In an optional embodiment of the present invention, the photodetector 200 further comprises an insulation layer 208 disposed between the waveguide layer 204 and the Ge detection layer 206. The insulation layer 208 comprises a thin layer of dielectric material. The insulation layer 208 provides efficient electrical isolation of the detection layer 206 from the waveguide layer 204, thereby substantially reducing the collection of photocarriers generated in the waveguide layer 204 and increasing the operational bandwidth of the photodetector 200. At the same time, it is important to avoid excessive optical isolation of the detection layer 206 due to the excess thickness of the insulation layer 208 (i.e., the thickness of the insulation layer 208 may reduce the efficiency of the coupling of light from the waveguide layer 204 to the detection layer 206). In one embodiment, the insulation layer 208 has a thickness of less than approximately 50 nanometers to provide electrical insulation and to substantially avoid excessive optical isolation of the detection layer 206. In one embodiment, the insulation layer 208 is made of silicon dioxide. In another embodiment, the insulation layer 208 is made of silicon oxynitride ($SiO_xN_{1-x}$) or materials with high dielectric constants (i.e., high-k dielectrics) like hafnium oxide (HfO), among others.

In operation, a single mode of incident light enters and propagates through the waveguide layer 204. The optical waveguiding function is realized by the waveguide layer 204 alone (i.e., no waveguiding occurs in the detection layer 206), while the detection function is realized by the detection layer 206 alone, resulting in a single-moded structure along the entire length of the photodetector 200. Thus, as the light is guided through the waveguide layer 204, the evanescent field in the exponential tail of the waveguide layer 204 is absorbed by the detection layer 206. This results in two important advantages. First, the relatively small thickness of the detection layer 206 allows for a reduction in reflection (and hence power loss) at the interface of the waveguide layer 204 and the detection layer 206. Second, the tolerance of the photodetector 200 to inevitable variations in material growth and fabrication are improved. This is because along the entire photodetector 200, only one guiding mode exists.

Moreover, even though the reduced dimensions of the detection layer 206 result in a small effective absorption coefficient, the internal quantum efficiency can still approach approximately one hundred percent using a detection layer 206 with a length of greater than approximately 40 μm at an incident light wavelength of 1.3 μm (e.g., where the total volume of the detection layer 206 is still approximately 1 μm$^3$).

Figure 3:
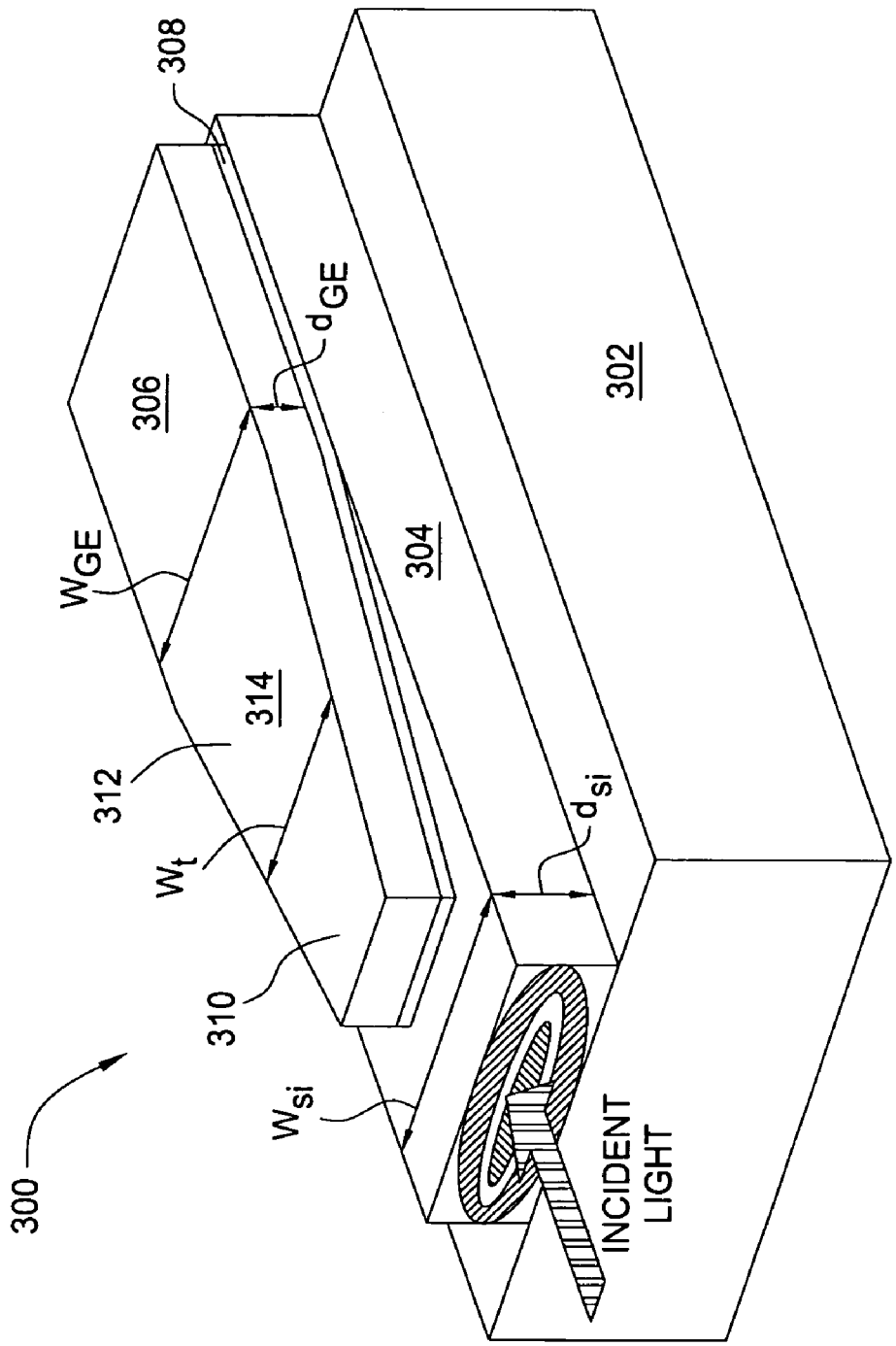
FIG. 3 is a perspective view of a third embodiment of a waveguide photodetector, according to the present invention.

FIG. 3 is a perspective view of a third embodiment of a waveguide photodetector 300, according to the present invention. Specifically, the photodetector 300 is a waveguide photodetector with an adiabatic taper coupler. To this end, the photodetector 300 comprises a substrate 302, a waveguide layer 304 formed on the substrate 302 and a detection layer 306 formed on the waveguide layer 304. Thus, in this embodiment, the waveguide layer 304 is effectively "sandwiched" between the substrate 302 and the detection layer 306. In alternative embodiments, however, the entire photodetector structure may be buried under a thick oxide layer, in which case there is no "sandwiching" of the waveguide layer 304.

The substrate 302 is an insulator. In one embodiment, the substrate 302 is a buried oxide substrate. The waveguide layer 304 is a single-mode strip waveguide in a wavelength of interest along its entire length. That is, the waveguide layer 304 provides, along its length, for the waveguiding of only a single mode of incident light. In one embodiment, the waveguide layer 304 is formed of silicon. In one embodiment, the waveguide layer 304 has a width, $w_{Si}$, in the range of approximately 350 nanometers to approximately 550 nanometers and a thickness, $d_{Si}$, of less than or equal to approximately 220 nanometers. The relatively small dimensions of the waveguide layer 304 substantially ensure single-mode operation of the waveguide layer 304 for wavelengths in the range of approximately 1.3 μm to approximately 1.55 μm. Moreover, light can be effectively confined in the waveguide layer 304 due to the relatively large contrast in refractive index between silicon and an oxide or air.

The detection layer 306 is, like the waveguide layer 304, a single-mode strip waveguide and functions as both a waveguiding region and a photodetector or absorption region. In one embodiment, the detection layer 306 is formed of single-crystal germanium. In another embodiment, the detection layer 306 is formed of other germanium-containing materials (e.g., poly-germanium, a silicon/germanium composite (e.g., $Si_xGe_{1-x}$) or a silicon/germanium/carbon composite (e.g., $Si_xGe_yC_{1-x-y}$)). The detection layer 306 includes a tapered region 314. The width, $w_t$, of the tapered region 314 is tapered such that the width, $w_t$, is smallest at a first end 310 of the tapered section 314 and increases to a maximum width at a second end 312 of the tapered section 314. The width at the first end 310 of the tapered section 314 is small enough that the effective index of the detection layer 306 is almost equal to the effective index of the waveguide layer 304 (e.g., no guiding modes). Thus, the width at the first end 310 of the tapered section 314 is in the range of approximately zero to approximately the width, $w_{Ge}$, of the remainder of the detection layer 306. The width at the second end 312 of the tapered section 314 is substantially equal to the width, $w_{Ge}$, of the remainder of the detection layer 306. In one embodiment, the thickness, $d_{Ge}$, of the detection layer 306 is in the range of approximately 150 nanometers to approximately 180 nanometers.

In an optional embodiment of the present invention, the photodetector 300 further comprises an insulation layer 308 disposed between the waveguide layer 304 and the detection layer 306. The insulation layer 308 comprises a thin layer of dielectric material. The insulation layer 308 provides efficient electrical isolation of the detection layer 306 from the waveguide layer 304, thereby substantially reducing the collection of photocarriers generated in the waveguide layer 304 and increasing the operational bandwidth of the photodetector 300. At the same time, it is important to avoid excessive optical isolation of the detection layer 306 due to the excess thickness of the insulation layer 308 (i.e., the thickness of the insulation layer 308 may reduce the efficiency of the coupling of light from the waveguide layer 304 to the detection layer 306). In one embodiment, the insulation layer 308 has a thickness of less than approximately 30 nanometers to provide electrical insulation and to substantially avoid excessive optical isolation of the detection layer 306. In one embodiment, the insulation layer 308 is made of silicon dioxide. In another embodiment, the insulation layer 308 is made of silicon oxynitride ($SiO_xN_{1-x}$) or materials with high dielectric constants (i.e., high-k dielectrics) like hafnium oxide (HfO), among others.

In operation, a single mode of incident light enters and propagates through the waveguide layer 304. As the light propagates through the waveguide layer 304 and encounters the tapered section 314 of the detection layer 306, the light is gradually coupled to the detection layer 306. That is, due to the tapered width of the detection layer 306, the light propagating through the waveguide layer 304 gradually encounters the detection layer 306 (i.e., the width of the detection layer 306 increases in the direction of the light's propagation). Accordingly, light is coupled from the waveguide layer 304 almost completely to the fundamental (zeroeth-order) mode of the combined waveguide section (i.e., the portion of the photodetector 300 in which the tapered section 310 of the detection layer 306 resides adjacent to the waveguide layer 304). Moreover, once the light is completely transferred to the detection layer 306, the optical waveguiding and detection (absorption) functions are both realized solely by the detection layer 306. Notably, only the fundamental (or zeroeth-order) mode is excited along the length of the photodetector 300 in operation (although multiple modes may exist in the detection region, i.e., the detection layer 306).

While the confinement factor of the fundamental (or zeroeth-order) mode in the detection layer 306 approaches one hundred percent, length of the photodetector 300 can be reduced to less than approximately 10 µm, which further reduces the capacitance and enhances the bandwidth of the photodetector 300. At the same time, the total volume of the detection layer 306 can be kept under approximately 1 µm³. Additionally, the enhanced confinement factor of the fundamental mode in the detection layer 306 enables the photodetector 300 to be operated at extended wavelengths (e.g., at approximately 1.55 µm and longer) without sacrificing a significant amount of bandwidth.

Additionally, the gradual interface between the waveguide layer 304 and the detection layer 306 allows for a significant reduction in reflection as compared with a more abrupt interface.

Two different types of photodiodes can be realized in accordance with the photodetector structures described with reference to FIGS. 1-3. In particular, both metal-semiconductor-metal (MSM) and p-type intrinsic n-type (p-i-n) photodiodes can be realized by implementing electrical contacts that contact and apply voltage to the detection layers (e.g., detection layers 106, 206 and 306). However, the use of conventional contact schemes, such as inter-digitated finger type contacts that form a diffraction grating sort of structure, would likely subject the photodetector to loss (e.g., due to light absorption in the finger-shaped contacts) and mode scatter (e.g., due to the diffraction grating-like structure), resulting in significant degradation of the photodetector's responsivity.

Figure 4B:
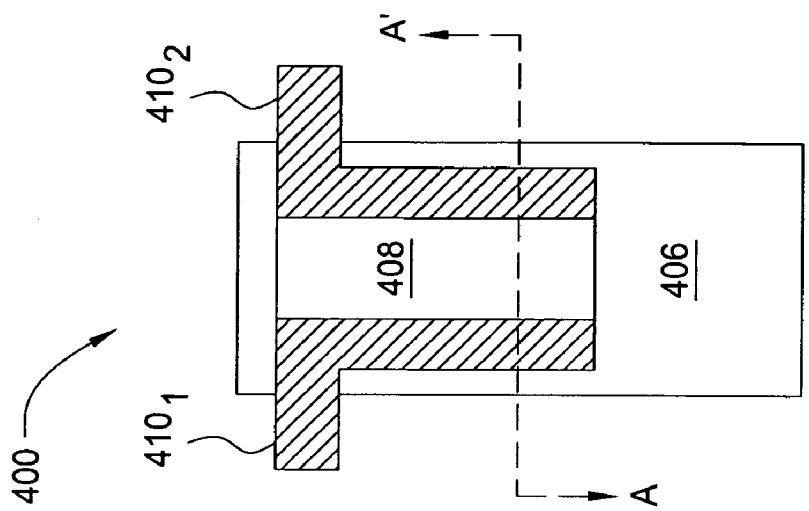
FIGS. 4A and 4B illustrate, respectively, a cross-sectional and top view of one embodiment of a photodetector with lateral contacts, according to the present invention.
Figure 4A:
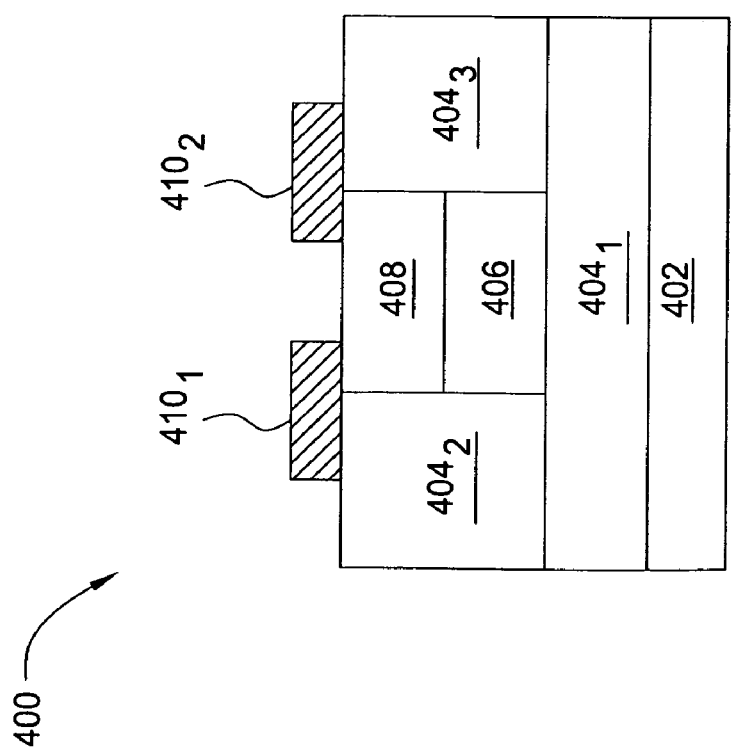

FIGS. 4A and 4B illustrate, respectively, a cross-sectional (taken along line A-A' of FIG. 4B) and top view of one embodiment of a photodetector 400 with lateral contacts, according to the present invention. The photodetector 400 comprises a substrate 402, a silicon dioxide layer 404 (i.e., comprising portions $404_1$, $404_2$ and $404_3$) formed on the substrate 402, a waveguide layer 406 formed on the silicon dioxide layer 404, a detection layer 408 formed on the waveguide layer 406, and first and second electrical contacts $410_1$ and $410_2$, respectively (hereinafter collectively referred to as "contacts 410").

The substrate 402 is, in one embodiment, formed of silicon. The silicon dioxide layer 404 comprises three main sections: a first section $404_1$ formed directly on the substrate 402; a second section $404_2$ formed on the first section $404_1$ and adjacent a first longitudinal side of the waveguide layer 406 and detection layer 408; and a third section $404_3$ formed on the first section 404 and adjacent a second longitudinal side of the waveguide layer 406 and detection layer 408 (i.e., such that the second section $404_2$ and the third section $404_3$ are separated by the waveguide layer 406 and detection layer 408. In one embodiment, the waveguide layer 406 is formed of silicon, while the detection layer 408 is formed of germanium.

The contacts 410 comprise metallic contacts (e.g., titanium, aluminum, nickel, copper or other metals). The first contact $410_1$ and the second contact $410_2$ are disposed in a spaced-apart, substantially parallel manner (i.e., a "transmission line" configuration) and extend lengthwise along the length of the detection layer 408. Thus, a plasmonic waveguide is formed. In the embodiment illustrated in FIGS. 4A and 4B, the contacts 410 are positioned directly on a top surface of the photodetector 400 (i.e., such that the first contact $410_1$ straddles the second section $404_2$ of the silicon dioxide layer and the detection layer 308, and the second contact $410_2$ straddles the third section $404_3$ of the silicon dioxide layer and the detection layer 308).

The contacts 410 perform two main functions. First, the contacts 410 function as improved carrier collectors for photogenerated carriers. Second, the contacts 410 enhance the confinement of the optical field and reduce optical diffraction loss, which improves the performance of the photodetector in several ways. For instance, concentration of the optical mode between the contacts 410 results in an increase in local field intensity, and, correspondingly, an increase in effective absorption coefficient for the detection layer 408 (e.g., lower parasitic losses due to absorption of light by the contacts are realized). Thus, the active length of the photodetector 400 can be reduced.

Figure 5B:
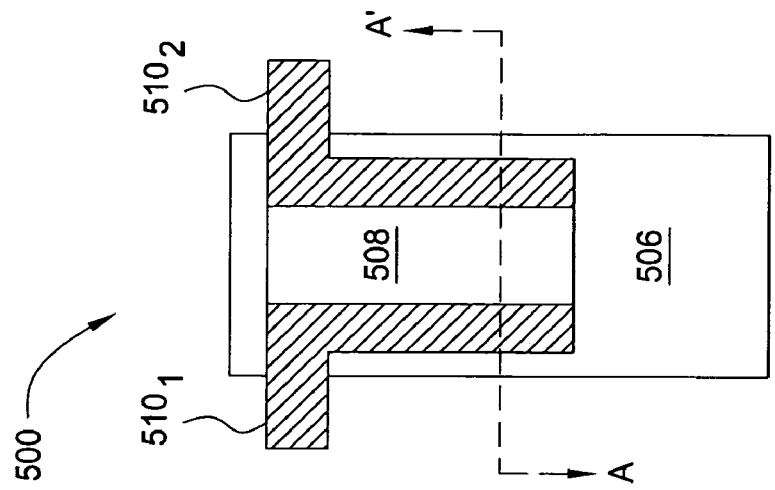
FIGS. 5A and 5B illustrate, respectively, a cross-sectional and top view of one embodiment of a photodetector with lateral contacts, according to the present invention.
Figure 5A:
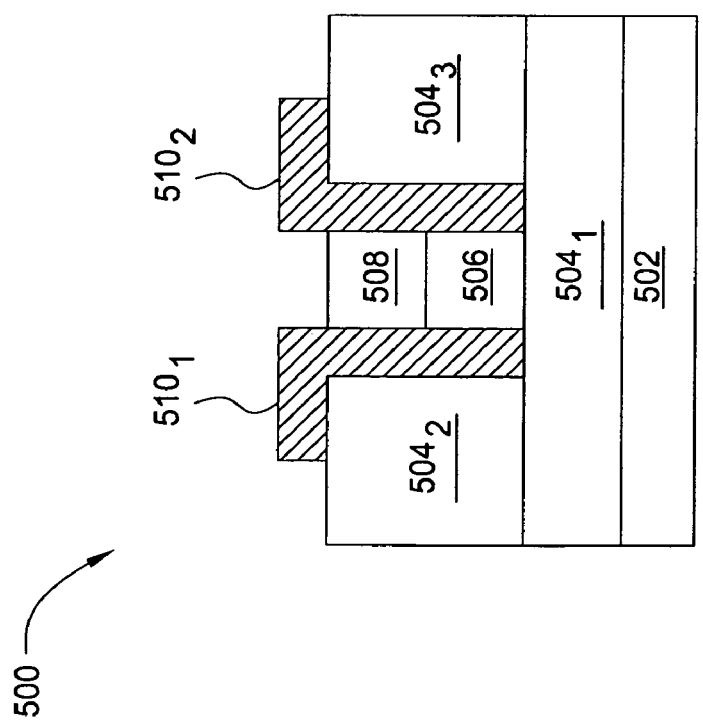

FIGS. 5A and 5B illustrate, respectively, a cross-sectional (taken along line A-A' of FIG. 5B) and top view of one embodiment of a photodetector 500 with lateral contacts, according to the present invention. The photodetector 500 is substantially similar to the photodetector 400 illustrated above and comprises a substrate 502, a silicon dioxide layer 504 (i.e., comprising portions $504_1$, $504_2$ and $504_3$) formed on the substrate 502, a waveguide layer 506 formed on the silicon dioxide layer 504, a detection layer or layer 508 formed on the waveguide layer 506, and first and second electrical contacts $510_1$ and $510_2$, respectively (hereinafter collectively referred to as "contacts 510").

The substrate 502 is, in one embodiment, formed of silicon. The silicon dioxide layer 504 comprises three main sections: a first section $504_1$ formed directly on the substrate 502; a second section $504_2$ formed on the first section $504_1$ and adjacent a first longitudinal side of the waveguide layer 506 and detection layer 508; and a third section $504_3$ formed on the first section $504_1$ and adjacent a second longitudinal side of the waveguide layer 506 and detection layer 508 (i.e., such that the second section $504_2$ and the third section $504_3$ are separated by the waveguide layer 506 and detection layer 508. In one embodiment, the waveguide layer 506 is formed of silicon, while the detection layer 508 is formed of germanium.

The contacts 510 comprise metallic contacts (e.g., titanium, aluminum, nickel, copper or other metals). The first contact $510_1$ and the second contact $510_2$ are disposed in a spaced-apart, substantially parallel manner (i.e., a "transmission line" configuration) and extend lengthwise along the length of the detection layer 508. Thus, a plasmonic waveguide is formed. Unlike the embodiment illustrated in FIGS. 4A and 4B, however, the contacts 510 are L-shaped such that they contact not just a top surface of the photodetector 500, but also extend through the top surface of the photodetector 500, toward the first section 504$_1$ of the silicon dioxide layer (i.e., such that the first contact 510$_1$ is positioned above the second section 504$_2$ of the silicon dioxide layer and adjacent (lateral) to the detection layer 508 and waveguide layer 506, and the second contact 510$_2$ is positioned above the third section 404$_3$ of the silicon dioxide layer and adjacent to the detection layer 508 and waveguide layer 506).

The contacts 510 perform the same main functions and realize the same advantages as the contacts 410 illustrated in FIGS. 4A and 4B. However, the contacts 510 can provide greater concentration of light than the contacts 410. The tradeoff is that the contacts 410 are easier to manufacture than the contacts 510 due to the fact that the contacts 410 do not extend into the depth of the photodetector 400.

Thus, the present invention represents a significant advancement in the field of optical waveguides. A scalable, horizontal in-plane waveguide photodetector is provided that allows efficient coupling of light from a waveguiding region to a detection region, while also minimizing dark current. Moreover, when implemented in conjunction with improved electrical contact configurations, parasitic losses can be reduced and collection of photogenerated carriers can be increased.

While foregoing is directed to the preferred embodiment of the present invention, other and further embodiments of the invention may be devised without departing from the basic scope thereof, and the scope thereof is determined by the claims that follow.

The invention claimed is:

1. A waveguide photodetector comprising:
   a first silicon dioxide layer;
   a waveguide layer formed on a portion of the first silicon dioxide layer, where light is guided or is confined; and
   a detection layer formed on the waveguide layer, where guided light is detected, the detection layer functioning to guide the light and being formed of at least one of: single-crystal germanium, a silicon-germanium composite, or a silicon/germanium/carbon composite;
   a second silicon dioxide layer formed on the first silicon dioxide layer and positioned adjacent to a first longitudinal side of the waveguide layer and the detection layer;
   a third silicon dioxide layer formed on the first silicon dioxide layer and positioned adjacent to a second longitudinal side of the waveguide layer and the detection layer, such that the third silicon dioxide layer is separated from the second silicon dioxide layer by the waveguide layer and the detection layer;
   a first electrical contact coupled to the detection layer and positioned to straddle the second silicon dioxide layer and the detection layer; and
   a second electrical contact coupled to the detection layer and positioned to straddle the third silicon dioxide layer and the detection layer,
   wherein each of the waveguide layer and the detection layer allows for the guiding of no more than a single mode of light for a given polarization.

2. The waveguide photodetector of claim 1, wherein at least one of the waveguide layer and the detection layer comprises a single-mode strip waveguide in a wavelength of interest.

3. The waveguide photodetector of claim 1, wherein the waveguide layer is formed of silicon.

4. The waveguide photodetector of claim 1, further comprising:
   a layer of dielectric material disposed between the waveguide layer and the detection layer.

5. The waveguide photodetector of claim 1, wherein the waveguide layer and the detection layer are configured to allow for resonant coupling of light from the waveguide layer to the detection layer.

6. The waveguide photodetector of claim 1, wherein the waveguide layer and the detection layer are configured to allow for evanescent coupling of light from the waveguide layer to the detection layer.

7. The waveguide photodetector of claim 6, wherein the detection layer operates at a cutoff condition.

8. The waveguide photodetector of claim 7, wherein the waveguide photodetector is a single-moded structure along an entire length of the waveguide photodetector.

9. The waveguide photodetector of claim 1, wherein the waveguide layer and the detection layer are configured to allow for adiabatic coupling of light from the waveguide layer to the detection layer.

10. The waveguide photodetector of claim 9, wherein the detection layer comprises a tapered section that increases in width along a direction in which the waveguide photodetector is configured for the propagation of light.

11. The waveguide photodetector of claim 1, wherein the first electrical contact and the second electrical contact are disposed in a spaced-apart, substantially parallel manner relative to each other.

12. The waveguide photodetector of claim 1, wherein the first electrical contact and the second electrical contact each comprise at least one of: titanium, aluminum, nickel, or copper.

13. The waveguide photodetector of claim 1, wherein each of the first electrical contact and the second electrical contact extends lengthwise along a length of the detection layer.

14. The waveguide photodetector of claim 1, wherein each of the first electrical contact and the second electrical contact is positioned to contact at least a portion of a top surface of the detection layer.

15. The waveguide photodetector of claim 14, wherein each of the first electrical contact and the second electrical contact is further positioned to contact at least a portion of a lateral surface of the detection layer.

* * * * *